(12) United States Patent
Krans et al.

(10) Patent No.: US 6,593,584 B2
(45) Date of Patent: Jul. 15, 2003

(54) MULTI-BEAM LITHOGRAPHY APPARATUS WITH MUTUALLY DIFFERENT BEAM LIMITING APERTURES

(75) Inventors: Jan Martijn Krans, Eindhoven (NL); Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 202 days.

(21) Appl. No.: 09/745,940

(22) Filed: Dec. 22, 2000

(65) Prior Publication Data

US 2001/0017739 A1 Aug. 30, 2001

(30) Foreign Application Priority Data

Dec. 23, 1999 (EP) .............................. 99204502

(51) Int. Cl.[7] .............................................. H01J 37/073
(52) U.S. Cl. .................. 250/492.2; 250/492.3
(58) Field of Search .................. 250/492.2, 492.21, 250/492.22, 492.3, 492.23

(56) References Cited

U.S. PATENT DOCUMENTS

| | | | | |
|---|---|---|---|---|
| 4,694,178 A | * | 9/1987 | Harte | 250/396 R |
| 4,974,736 A | * | 12/1990 | Okunuki et al. | 219/121.12 |
| 6,014,200 A | * | 1/2000 | Sogard et al. | 250/492.3 |
| 6,369,385 B1 | * | 4/2002 | Muray et al. | 250/306 |

FOREIGN PATENT DOCUMENTS

EP            0289278 A2    11/1988         H01J/37/073

OTHER PUBLICATIONS

"Miniaturized e–Beam Writer: Testing of Components", by C. Stebler et al, Microelectronic Engineering 27 (1995) 155–158.

"Electron–Beam Microcolumns for Lithography and Related Applications" by T.H.P Chung et al, J. Vac. Sci. Technol. B 14(6), Nov./Dec. 1996, pp. 3774–3781.

"Electron Beam Technology—SEM to Microcolumn" by T.H.P. Chang et al, Microelectronic Engineering 32 (1996) 113–130, pp. 113–130.

\* cited by examiner

*Primary Examiner*—John R. Lee
*Assistant Examiner*—Anthony Quash
(74) *Attorney, Agent, or Firm*—Michael O. Scheinberg; Erik R. Nordstrom

(57) ABSTRACT

Multi-beam lithography apparatus is used for writing patterns on a substrate 14 such as a wafer for ICs. The patterns may have details of various dimensions. In order to enhance the production rate, it is attractive to write fine details with a small spot 16 and large details with a large spot. It is known to vary the spot size by varying the emissive surface of the electron source. In accordance with the invention the spot size is varied by varying the size 22 of the beam limiting aperture 20, thus enabling optimization of the beam current in dependence on the spot size. A preferred embodiment is provided with an additional (condenser) lens 24 such that the object distance remains constant when the magnification of the lens system 18, 24 is varied.

11 Claims, 3 Drawing Sheets

MULTI-BEAM LITHOGRAPHY APPARATUS WITH MUTUALLY DIFFERENT BEAM LIMITING APERTURES

BACKGROUND OF THE INVENTION

The invention relates to a particle-optical apparatus which includes
(a) an object carrier for an object to be irradiated by means of the apparatus, and
(b) an array of particle-optical columns, each of which is provided with:
   at least one particle source for producing a limited particle beam of electrically charged particles,
      a focusing device for forming a focus of the particle beam in the vicinity of the object carrier.

An apparatus of this kind is known from the published European patent application EP 0 289 278 A2.

The apparatus described in the cited patent application is arranged to write patterns on a substrate by means of electron beams in order to manufacture semiconductor circuits. Therein, the substrate to be written is arranged on an object carrier which faces the array of particle-optical columns. In the context of the present application a particle-optical column is to be understood to mean an assembly consisting of a particle source and a focusing device. The particle source produces a beam of electrically charged particles (generally an electron beam) which is focused by the focusing device that is usually referred to as the objective. The electron beam focus thus formed is situated on the substrate, so that a sharp electron spot is projected onto the substrate. The desired pattern is written by displacement of the spot. Even though no indication as regards the limiting of the electron beam can be derived from the cited European application, the beam is always limited by nature.

Generally speaking, apparatus for writing patterns by means of electron beams are constructed so as to include a plurality of particle-optical columns in order to increase the production rate in comparison with an apparatus provided with one particle-optical column only. Such columns operate in parallel during writing. An apparatus of this kind could be configured in such a manner that all columns have the same effect, that is, that they produce exactly the same current in the same spot size. However, the pattern to be written may contain details of different magnitude. In that case the small details can be written by means of an electron spot having a small diameter whereas the larger details can be written with a spot having a larger diameter. This offers the advantage that in a larger electron spot usually a larger current will be present, so that the writing of comparatively large details can take place at a speed that is higher than the speed of writing while using a small spot, thus enabling optimization of the production rate of the objects to be described. In other words, due to lens defects, for example chromatic and spherical aberration and interaction (Coulomb repulsion) of the electrons in the beam, an electron spot cannot be made arbitrarily small for a given current in the beam.

In order to achieve said advantage of optimum production rate, the known assembly is provided with columns that are capable of producing beams with mutually different currents. The known assembly of columns producing electron beams is mounted on a straight carrier arm which is arranged over the substrate to be written. The columns that are mounted on one arm differ from one another in as far as the magnitude of their beam current is concerned. In the cited European patent application this effect is achieved in that an electron source having a comparatively large emissive surface is provided so as to produce a beam with a large current; this possibility is described therein notably with reference to FIG. 6D. It is also described (notably with reference to FIG. 3) that two electron emitters that are arranged close to one another can operate simultaneously, so that these sources together produce a beam with a comparatively large current.

This known method of varying the beam current within an array of columns has the drawback that increasing of the emissive surface generally does not result in an increase of the beam current by the same factor; the beam current is increased by a substantially smaller factor under the influence of said lens defects and electron interaction.

OBJECT OF THE INVENTION

It is an object of the invention to provide a particle-optical apparatus of the kind set forth in which the variation of the beam current can be optimized. To this end, the apparatus in accordance with the invention is characterized in that the columns are also provided with a beam limiting aperture which is situated between the associated particle source and the associated focusing device, and
   the array of particle-optical columns is subdivided into at least a first group of columns and a second group of columns, the columns in the first group being provided with a beam limiting diaphragm of a first diameter and the columns in the second group being provided with a beam limiting diaphragm of a second diameter, said first and second diameters being mutually different.

The invention is based on the recognition of the fact that the beam current can be controlled better by limiting the beam by means of an aperture (in the form of a diaphragm) arranged between the source and the objective (that is, the focusing device) than by increasing the emissive surface of the electron source. In the latter case the lens defects of the objective, such as the chromatic aberration and the spherical aberration, cannot be involved in the optimization process and the spot size is determined entirely by the sum of the effects of the Coulomb interaction and said lens defects.

Each column of the first group and the second group in an embodiment of the particle-optical apparatus according to the invention is provided with a further particle lens for varying the magnification of the relevant column in co-operation with the associated focusing device.

This step offers the advantage that a further degree of freedom is obtained for influencing the beam current. The magnification of the system, that is, the ratio of the size of the electron spot on the object to be written to the actual emissive surface, can thus be adjusted as desired.

The further particle lenses in a preferred embodiment of the particle-optical apparatus according to the invention are arranged to vary, in co-operation with the associated focusing device, the magnification of the relevant column while keeping constant the distance between the focusing device and the object carrier.

This step offers considerable advantages from a manufacturing point of view, because the individual columns may now have the same physical dimensions, apart from the beam limiting diaphragm which is often mounted as a separate part any way. The array of columns can now be mounted on a unity carrier whose appearance is independent of the number and the variety of the columns that differ in respect of spot size. Moreover, only one size of column need be manufactured and stocked.

The further particle lens in a further embodiment of the particle-optical apparatus in accordance with the invention is arranged between the associated particle source and the associated beam limiting aperture. As a result of this step the further particle lens is given the function of a condenser lens so that the beam current in the electron spot can be optimized thereby by control of the magnification of the system, while the distance between the focusing device and the object carrier can still remain the same.

BRIEF DESCRIPTION OF THE DRAWINGS

The invention will be described in detail hereinafter with reference to the Figures in which corresponding reference numerals denote corresponding elements. Therein:

FIG. 1 shows diagrammatically an array 2 of n columns 4-1, ..., 4-n which have mutually different diaphragms and are provided with an objective only. The columns 4 are assembled so as to form an array by mounting the columns on a common carrier 6. Even though the Figure shows a one-dimensional array, the invention can also be used in the case of a two-dimensional array. In each of the columns the electron beams 8 are produced by an electron source 10 of a conventional type; for this purpose use is preferably made of an electron source of the Schottky field emission type because the (virtual) dimensions of the emissive surface do not impose an undesirable limitation as regards the size of the electron spot in such a case.

DESCRIPTION OF THE PREFERRED EMBODIMENTS

Figure 1:
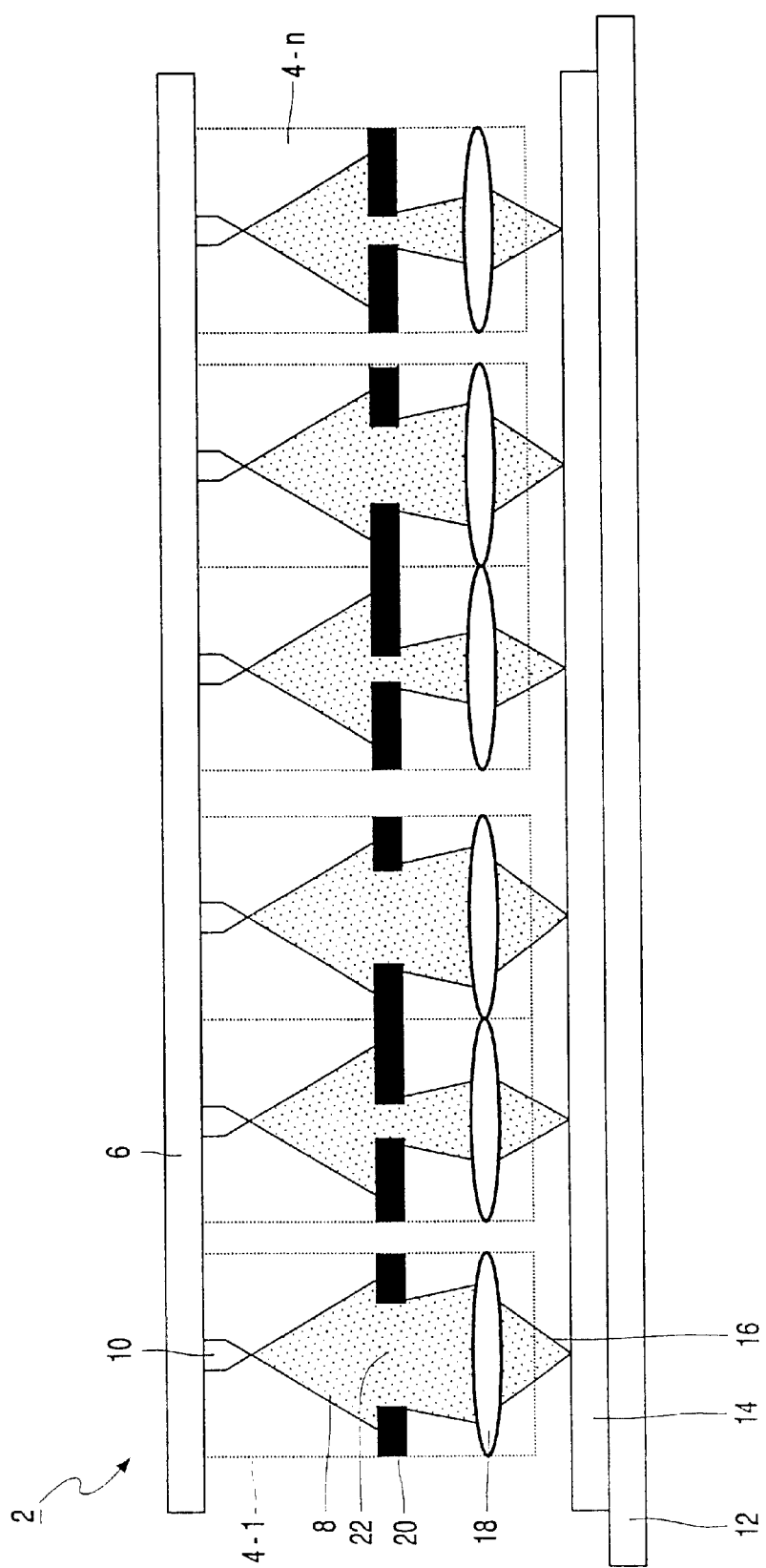
FIG. 1 shows diagrammatically an array of columns with mutually different diaphragms with an objective only.

The array 2 of columns is arranged over an object carrier 12 on which the substrate 14 to be inscribed is arranged. The pattern to be written onto the substrate is formed by displacing an electron spot 16 relative to the surface of the substrate, that is, preferably by displacing the electron beam in mutually perpendicular directions by means of electric or magnetic deflection fields. Because the field generating coils or electrodes to be used for this purpose are not of essential importance to the invention, they are not shown in the Figure.

The electron spot 16 is formed by imaging the emissive surface of the electron source 10 on the surface of the substrate 14 by means of the objective, that acts as a focusing device. The dimensions of the electron spot are then determined mainly by the dimensions of the emissive surface, the degree of interaction (Coulomb repulsion) between the electrons in the beam, and the chromatic and spherical aberration of the objective 18. The latter lens faults are dependent on the angle of aperture of the electron beam which is co-determined by the size of the opening 22 of the beam limiting aperture, so of the diaphragm 20. The spot enlargement due to the Coulomb repulsion between the electrons is dependent on the current in the electron beam; this is understandable because a large number of electrons also causes a large mutual repelling force. The size of the electron spot 16 can thus be influenced by selection of the dimensions of the opening 22, so that a large spot involving a large current can be used for writing large details in the pattern to be written whereas small details can be written by means of a small spot.

The objective may have an arbitrary, customary shape. For an array of columns, however, it is often desirable that the columns are of small dimensions. Therefore, for this application often an electrostatic objective will be chosen, because such objectives have small dimensions in comparison with magnetic lenses that have to be cooled because the field generating coils in such a lens conduct current.

Figure 2:
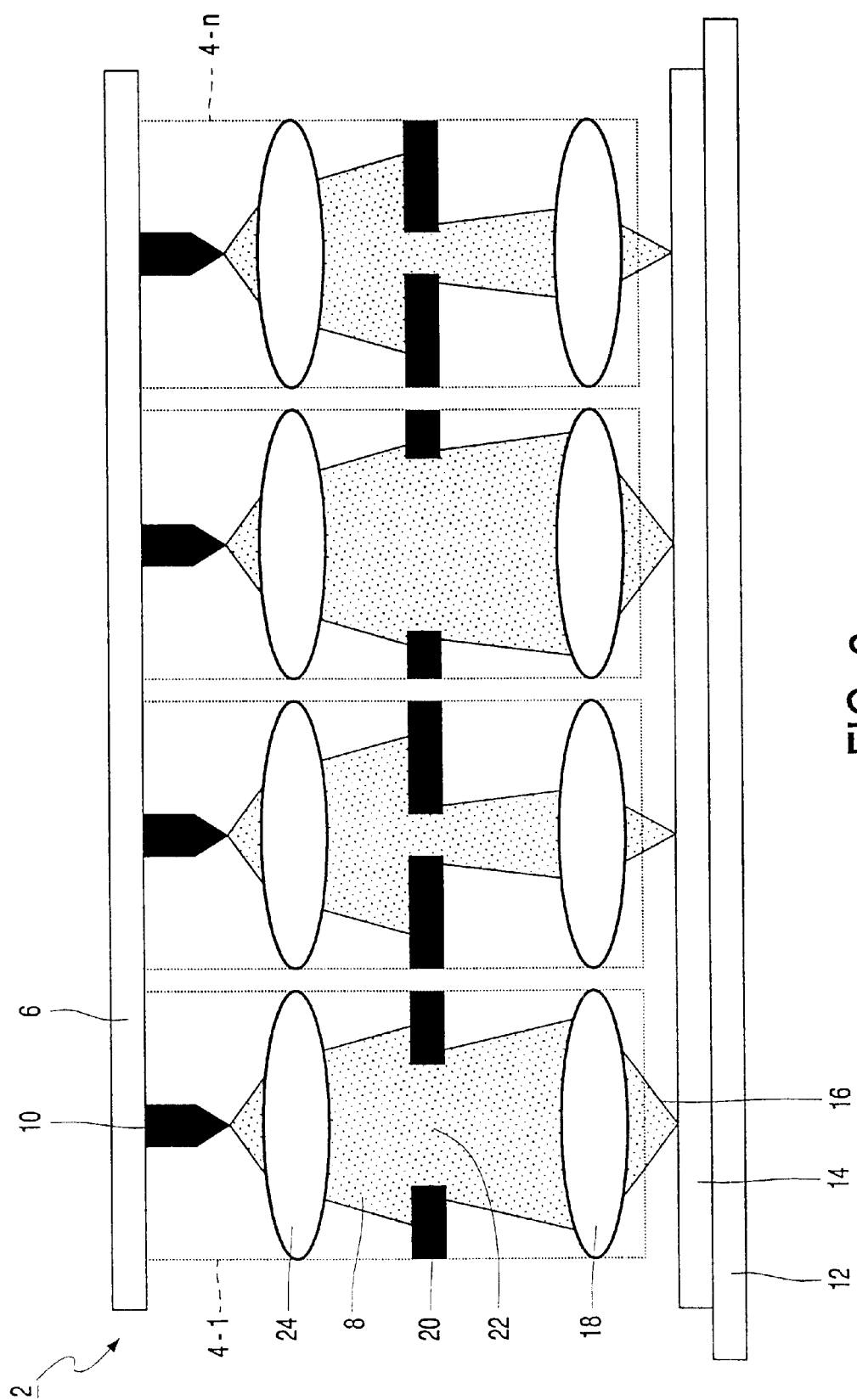
FIG. 2 is a diagrammatic view of an array of columns with mutually different diaphragms with an objective and a condenser lens.

FIG. 2 shows diagrammatically an array with mutually different diaphragms. The columns in this Figure are the same as those shown in FIG. 1, a difference being that each column in FIG. 2 is provided not only with an objective but also with a condenser lens 24. The condenser lens is arranged between the electron source 10 and the beam limiting diaphragm 20. As a result of the use of the condenser lens, the spot size can now be selected for the desired size of the details; for each spot size the maximum attainable current in the electron beam can be reached and the distance between the objective 18 and the surface of the substrate 14 to be written is independent of the selected spot size. The currents and spot sizes that can be achieved by means of this configuration have been determined by computer simulation. This simulation was based on two sizes of the diaphragm openings 22 in the array of columns, so that optimization can be performed in respect of two spot sizes.

The results of the computer simulation are given in the below Table in which the beam currents are given for different circumstances. The Table is subdivided into three groups of results. In the first group (consisting of the upper three rows of the Table) the results of the situations involving electron spots of 100 nm and 200 nm are compared. In the second group, (consisting of the central three rows of the Table) the results of the situations involving electron spots of 50 nm and 200 nm are compared. In the third group (consisting of the lower three rows of the Table) the results of the situations involving electron spots of 20 nm and 200 nm are compared.

The various columns in the Table contain the following: column 1 shows said two spot sizes in nanometers whereas column 2 states the method used to obtain the enlargement of the electron spot ("source" means enlargement of the emissive surface, "optim." means optimization while using the setting of the condenser lens 24 and the objective 18); column 3 shows the spot size in nanometers and column 4 shows the size of the emissive surface as perceived by the imaging elements in the column (the virtual source size) in nanometers; column 5 shows the diameter of the diaphragm opening 22 in micrometers and column 6 shows the current in the electron spot in nanoamperes; column 7 shows the gain factor of the beam current relative to the situation involving current variation by enlargement of the emissive surface of the electron source as is known from the state of the art, and column 8 shows the current density j in the electron spot, in $A/cm^2$, derived from the values of the columns 6 and 3.

TABLE 1

| 1 | 2 | 3 | 4 | 5 | 6 | 7 | 8 |
|---|---|---|---|---|---|---|---|
| 100 -> 200 | | 100 | 20 | 100 | 157 | | 2000 |
| | source | 200 | 34 | 100 | 452 | | 1439 |
| | optim. | 200 | 20 | 158 | 648 | 1.4 | 2063 |
| 50 -> 200 | | 50 | 20 | 75 | 44 | | 2236 |
| | source | 200 | 55 | 75 | 332 | | 1057 |
| | optim. | 200 | 20 | 158 | 648 | 2.0 | 2063 |
| 20 -> 200 | | 20 | 20 | 50 | 7.4 | | 2355 |
| | source | 200 | 110 | 50 | 223 | | 710 |

TABLE 1-continued

| 1 | 2 | 3 | 4 | 5 | 6 | 7 | 8 |
|---|---|---|---|---|---|---|---|
|   | optim. | 200 | 20 | 158 | 648 | 2.9 | 2063 |

Column 7 in the above Table clearly shows the gain in beam current that can be achieved by application of the invention. Comparison of the columns 7 and 8 clearly reveals that even though the current can be increased by enlarging the source, such an increase is at the expense at the current density as illustrated by comparison of the values in the column 8 in the rows "source" and those in the rows "optim." in column 8.

Figure 3:
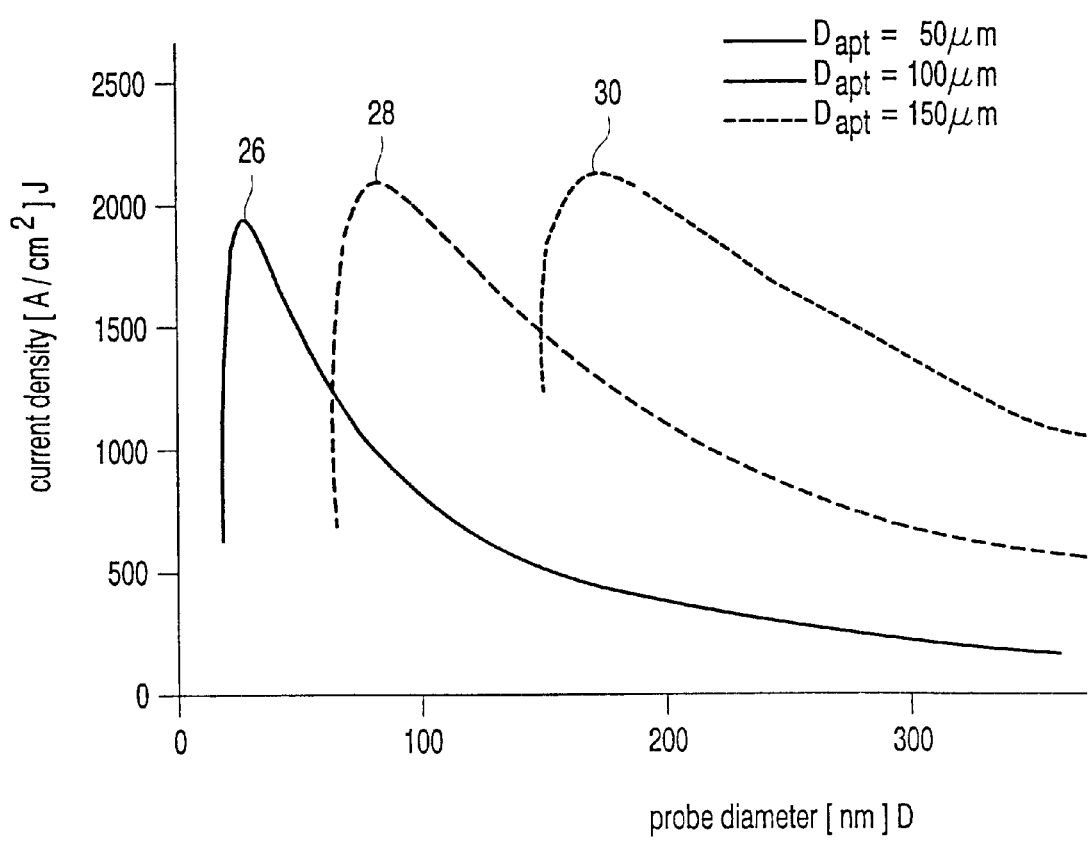
FIG. 3 illustrates graphically the relationship between the beam current and the size of the electron spot in a column that has been optimized in respect of beam current and includes an objective and a condenser lens.

FIG. 3 illustrates graphically the relationship between the beam current (that is, the current in the electron spot) and the size of the electron spot in a column which has been optimized in respect of beam current and includes an objective and a condenser lens. The three curves 26, 28 and 30 in the graph relate to a diaphragm opening of 50 µm, 100 µm and 150 µm, respectively. The values in this graph have been calculated by way of the above computer simulation. Each point for the current density J in the graph is found by determining, using the associated diaphragm opening and the desired spot size D, the maximum current in the electron beam by variation of the strength of the objective and the strength of the condenser lens in such a manner that the object distance remains constant.

What is claimed is:

1. A particle-optical apparatus which includes:
   (a) an object carrier (12) for an object (14) to be irradiated by means of the apparatus, and
   (b) an array (2) of particle-optical columns (4-i), each of which is provided with:
   at least one particle source (10) for producing a limited particle beam (8) of electrically charged particles,
      a focusing device (18) for producing a focus (16) of the particle beam in the vicinity of the object carrier, characterized in that
      the columns (4-i) are also provided with a beam limiting aperture (20) which is situated between the associated particle source (10-i) and the associated focusing device (18-i), and
      the array (2) of particle-optical columns (4-i) is subdivided into at least a first group of columns and a second group of columns, the columns in the first group being provided with a beam limiting diaphragm of a first diameter (22-k) and the columns in the second group being provided with a beam limiting diaphragm of a second diameter (22-m), said first and second diameters being mutually different.

2. A particle-optical apparatus as claimed in claim 1, wherein each column of the first group and the second group is provided with a further particle lens (24) for varying the magnification of the relevant column in co-operation with the associated focusing device (18).

3. A particle-optical apparatus as claimed in claim 2, wherein the further particle lenses (24-i) are arranged to vary, in cooperation with the associated focusing device (18-i), the magnification of the relevant column while keeping constant the distance between the focusing device (18-i) and the object carrier (12).

4. A particle-optical apparatus as claimed in claim 2, wherein the further particle lens (24-i) is arranged between the associated particle source (10-i) and the associated beam limiting aperture (20-i).

5. A particle-optical apparatus comprising:
   (a) an array of particle-optical columns, each column having:
      (i) at least one particle source for producing a particle beam of electrically charged particles,
      (ii) a focusing device for focusing the particle beam at an object to be irradiated, and
      (iii) a member with a beam limiting aperture situated between the particle source and the focusing device; wherein
   (b) the array of columns has two or more columns with apertures of different diameters.

6. The particle-optical apparatus as claimed in claim 5, wherein at least one of the columns includes a particle lens for varying the magnification of the column in co-operation with its associated focusing device.

7. The particle-optical apparatus as claimed in claim 6, wherein the particle lens is arranged in cooperation with the associated focusing device to vary the magnification of its column while maintaining the distance between the focusing device and the object to be irradiated.

8. The particle-optical apparatus as claimed in claim 6, wherein the particle lens is arranged between its associated particle source and beam limiting aperture.

9. An array of particle beam columns for a particle-optical apparatus, comprising:
   (a) two or more columns each having:
      (i) a particle source for producing a particle beam of electrically charged particles,
      (ii) an objective lens for focusing the particle beam proximal to an object carrier, and
      (iii) a member with a beam limiting aperture situated between the particle source and the objective lens, wherein
   (b) the two or more columns include at least two columns with beam limiting apertures of different diameters for generating beams having different spot diameters.

10. The array as claimed in claim 9, wherein each column further includes a condenser lens disposed between its associated particle source and beam limiting aperture for focusing the beam in cooperation with its associated objective lens.

11. The array as claimed in claim 10, wherein the condenser lens is arranged in cooperation with its associated focusing device to vary the magnification of its column while maintaining the distance between the objective lens and the object carrier.

* * * * *